US010615826B2

(12) United States Patent
Lemay et al.

(10) Patent No.: US 10,615,826 B2
(45) Date of Patent: Apr. 7, 2020

(54) JOSEPHSON JUNCTION-BASED TRANSCEIVER

(71) Applicant: The United States of America as represented by the Secretary of the Navy, San Diego, CA (US)

(72) Inventors: Lee Lemay, San Diego, CA (US); Marcio Calixto de Andrade, San Diego, CA (US)

(73) Assignee: United States of America as represented by the Secretary of the Navy, Washington, DC (US)

( * ) Notice: Subject to any disclaimer, the term of this patent is extended or adjusted under 35 U.S.C. 154(b) by 0 days.

(21) Appl. No.: 16/048,614

(22) Filed: Jul. 30, 2018

(65) Prior Publication Data

US 2020/0036399 A1    Jan. 30, 2020

(51) Int. Cl.
| | | |
|---|---|---|
| H04B 1/00 | (2006.01) | |
| H04B 1/40 | (2015.01) | |
| H01L 49/00 | (2006.01) | |
| H01L 39/22 | (2006.01) | |

(52) U.S. Cl.
CPC ........... *H04B 1/005* (2013.01); *H01L 39/223* (2013.01); *H01L 49/006* (2013.01); *H04B 1/40* (2013.01)

(58) Field of Classification Search
CPC ......... H04B 7/02; Y02D 70/442; H01Q 1/364
See application file for complete search history.

(56) References Cited

U.S. PATENT DOCUMENTS

| | | | | |
|---|---|---|---|---|
| 5,565,866 A | * | 10/1996 | Hamilton | ................ H03M 1/80 341/133 |
| 5,629,889 A | * | 5/1997 | Chandra | ................. G11C 11/44 257/31 |
| 5,790,078 A | * | 8/1998 | Suzuki | .................. H01Q 1/247 29/600 |
| 5,812,034 A | * | 9/1998 | Yoshida | ............... H01Q 13/085 333/125 |
| 6,242,939 B1 | * | 6/2001 | Nagasawa | ............... G11C 11/44 326/3 |
| 7,715,892 B2 | | 5/2010 | Welp | |
| 8,242,447 B1 | | 8/2012 | Chawla | |
| 8,633,472 B2 | | 1/2014 | Boulaevskii | |
| 9,948,254 B2 | | 4/2018 | Narla | |

(Continued)

OTHER PUBLICATIONS

Welp, Kadowaki, Kleiner, Superconducting emitters of THz radiation, Nature Photonics 7, 702-710 (2013) doi:10.1038/nphoton.2013. Published online Aug. 29, 2013.

(Continued)

*Primary Examiner* — Cindy Trandai
(74) *Attorney, Agent, or Firm* — Naval Information Warfare Center, Pacific; Kyle Eppele

(57) ABSTRACT

Disclosed is a transceiver that includes a three-dimensional array of Josephson junctions. When transmitting, the junctions drive an array of micro-antennas. When receiving, the micro-antennas drive the array of Josephson junctions. By extending the junction array into the third dimension, this transceiver packages a large number of Josephson junctions into a small volume, thus increasing the power of a transmitted beam. Multiple different micro-antenna arrays can be included, thus allowing the transceiver to work efficiently at multiple frequency ranges.

9 Claims, 3 Drawing Sheets

(56) References Cited

U.S. PATENT DOCUMENTS

| | | | | |
|---|---|---|---|---|
| 2008/0074338 A1* | 3/2008 | Vacanti | H01Q 1/28 | 343/771 |
| 2012/0243823 A1* | 9/2012 | Giboney | H01P 1/162 | 385/14 |
| 2014/0314419 A1* | 10/2014 | Paik | H04B 10/70 | 398/115 |
| 2015/0372217 A1* | 12/2015 | Schoelkopf, III | H01L 39/24 | 505/413 |
| 2016/0149111 A1* | 5/2016 | Cybart | H01L 39/025 | 505/190 |
| 2016/0267032 A1* | 9/2016 | Rigetti | G06F 13/36 | |
| 2018/0138987 A1* | 5/2018 | Sliwa | H04B 10/70 | |

OTHER PUBLICATIONS

Horiuchi, Superconducting emitter, Nature Photonics 9, 75 (2015) doi:10.1038/nphoton.2015.16 Published online Feb. 2, 2015.

Kitamura, Kasfhiwagi, Yamamoto, Tsujimoto, Watanabe, Ishida, Sekimoto, Asanuma, Yasui, Nakade, SHibano, Saiwai, Minami, Klemm, Kadowaki, Broadly tunable, high-power terahertz radiation up to 73 K from a stand-alone Bi2Sr2CaCu2O8+ōmesa.

Kashiwagi, Tsujimoto, Yamamoto, Minami, Yamaki, Delfanazari, Deguchi, Orita, Koike, Nakayama, Kitamura, Sawamura, Hagino, Ishida, Ivanovic, Asai, Tachiki, Klemm, Kadowaki, High Temperature Superconductor Terahertz Emitters: Fundamental Physics and Its Applications, Japanese Journal of Applied Physics 51 (2012) 010113.

Hao, Ji, Yuan, An, Li, Zhou, Huang, Sun, Zhu, Rudau, Wieland, Kinev, Li, Xu, Jin, Chen, Hatano, Koshelets, Koelle, Kleiner, Wang, Wu, Compact Superconducting Terahertz Source Operating in Liquid Nitrogen, Phys. Rev. Applied 3, 024006—Published Feb. 19, 2015.

Applied Superconductivity: Handbook on Devices and Applications, vol. 2, Editor: Paul Seidel, edited by Wiley-VCH publishing company.

Nanoscience and Engineering in Superconductivity, edited by Victor Moshchalkov, Roger Woerdenweber, Wolfgang Lang.

* cited by examiner

JOSEPHSON JUNCTION-BASED TRANSCEIVER

FEDERALLY SPONSORED RESEARCH OR DEVELOPMENT

The United States Government has ownership rights in this invention. Licensing inquiries may be directed to the Office of Research and Technical Applications, Space and Naval Warfare Systems Center, Pacific, Code 72120, San Diego, Calif., 92152; telephone (619)553-5118; email: ssc_pac_t2@navy.mil, referencing NC 103908.

TECHNICAL FIELD

The present disclosure is related generally to electromagnetic transceivers and, more particularly, to superconducting devices.

BACKGROUND

Transmitters can be built using Josephson junctions created by natural anisotropies in copper oxide-based high temperature superconductors. These anisotropies create stacks of conducting planes separated by insulating regions that combine to form numerous Josephson junctions. The performance of these transmitters is, however, limited by a material-dependent energy gap that sets a maximum voltage that can be applied across the Josephson junctions without destroying them. The transmitter's performance is further limited by the inherent mismatch of the layered superconducting structure and, in consequence, by its reduced surface area.

BRIEF SUMMARY

A transceiver includes a three-dimensional array of Josephson junctions. When transmitting, the junctions drive an array of micro-antennas. When receiving, the micro-antennas drive the array of Josephson junctions. By extending the junction array into the third dimension, this transceiver packages a large number of Josephson junctions into a small volume, thus increasing the power and focus of a transmitted beam. Multiple different micro-antenna arrays can be included, thus allowing the transceiver to work efficiently at multiple frequency ranges.

BRIEF DESCRIPTION OF THE SEVERAL VIEWS OF THE DRAWINGS

While the appended claims set forth the features of the present techniques with particularity, these techniques, together with their objects and advantages, may be best understood from the following detailed description taken in conjunction with the accompanying drawings of which:

DETAILED DESCRIPTION

Figure 1:
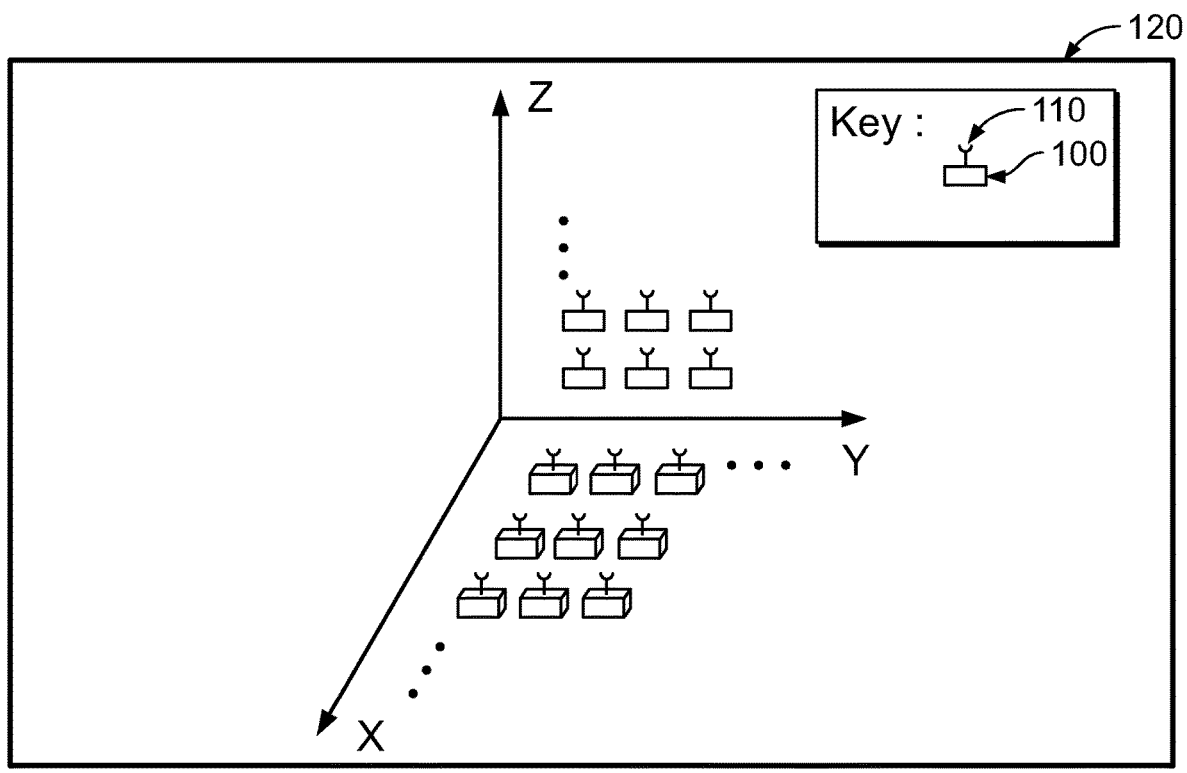
FIG. 1 is a schematic of a transceiver that includes an array of micro-antennas driven by a three-dimensional array of Josephson junctions.

Turning to the drawings, wherein like reference numerals refer to like elements, techniques of the present disclosure are illustrated as being implemented in a suitable environment. The following description is based on embodiments of the claims and should not be taken as limiting the claims with regard to alternative embodiments that are not explicitly described herein.

Properly configured, two superconducting layers separated by a "weak link," give rise to the "Josephson effect": A "supercurrent" flows from one superconducting layer to the other across the weak link even without the application of any voltage. A structure that supports the Josephson effect is known as a Josephson junction.

Josephson junctions are well known. Because each junction produces a very small effect, they are often formed together into large two-dimensional arrays to boost their capabilities. In one application, magnetic fields are precisely measured by an array of Josephson junctions fabricated onto a microchip. The array can also produce a very reliable standard voltage when electromagnetic radiation is directed at the junctions. In a complementary manner, putting a bias voltage across the junctions creates an electromagnetic emitter.

While useful for some delicate measurements, the application of Josephson junctions has been limited by the inherent weakness of the Josephson effect: Even with a significant two-dimensional array of thousands of junctions, it has been unfeasible to produce a beam of electromagnetic radiation that is both focused and of significant power. Simply increasing the driving voltage to increase the beam strength does not work because that quickly destroys the Josephson effect at the junctions.

The techniques of the present discussion overcome some of these shortcomings. Turning to FIG. 1, modern methods of micro-fabrication are enlisted to create a transceiver device 120 comprising a three-dimensional array of Josephson junctions 100 and associated micro-antennas 110. By moving into the third dimension, the density of the junctions 100 is greatly increased allowing substantial increases in the power of a transmitted beam without allowing the beam to become diffuse.

Figure 2:
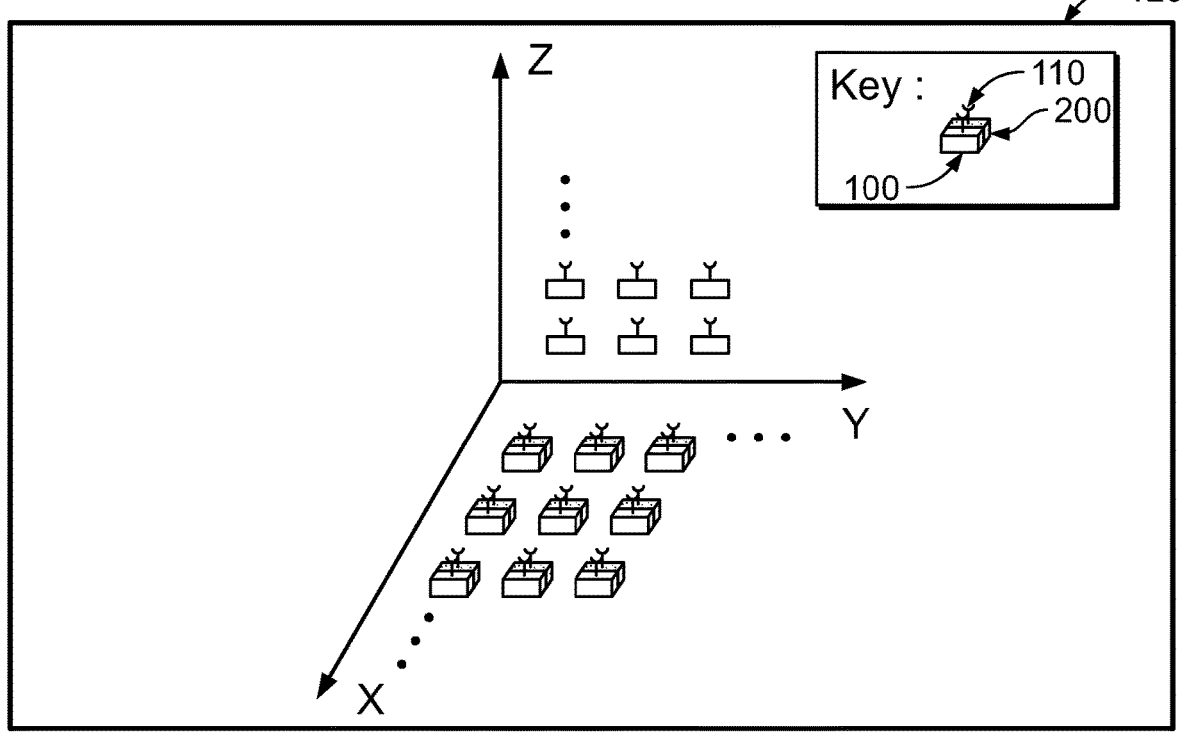
FIG. 2 is similar to FIG. 1 but shows two interleaved arrays of micro-antennas in the transceiver.

As shown in FIG. 2, the densities achievable can be so great that multiple arrays of antennas 110 with different characteristics can be interleaved within one transceiver 120. This enhances the flexibility of the transceiver 120, allowing one transceiver 120 to be used across multiple frequency ranges. Applications of this flexibility are discussed below.

The Josephson junctions 100 of FIGS. 1 and 2 may consist of any structure that exhibits the Josephson effect. When the weak link is a layer of insulator, the resulting junction 100 is called a superconductor-insulator-superconductor tunnel junction 100. Instead of an insulator, the weak link can simply be a non-superconducting material which results in a superconductor-normal-superconductor junction 100.

Other known methods of creating the junctions 100 include creating a structural "pinch point." This can be done by pointing an ion beam (during manufacture) at the site of the junction 100 to narrow the amount of superconducting material.

Structural differences in the materials making up the layers can give rise to the Josephson effect. Thus, junctions 100 can also be formed from grain boundaries, from the structural mismatch of two crystals, and from the edges formed when the layers are laid down.

Fabricated at the same time as the Josephson junctions 100, the micro-antennas 110 are configured for both transmission and reception, allowing the transceiver 120 to operate as both a transmitter and a receiver. When an alternating bias current is applied across the Josephson junctions 100, the micro-antennas 110 radiate electromagnetic energy at the frequency of the bias current.

In some embodiments, the transmission and reception frequencies range from the sub-terahertz into the terahertz. To allow the transceiver 120 to efficiently operate in this range, the frequency of the bias current across the Josephson junctions 100 is set to this range. Also, the micro-antennas 110 are fabricated to be of a size appropriate to this range. The practical limitation operating here is the size of micro-antenna 110 that can be reliably manufactured. For the desired terahertz range of frequencies, a representative efficient micro-antenna 110 would be about 75 microns long. In those embodiments where the transceiver 120 is fabricated onto a single microchip, that microchip could contain thousands of junctions 100 and micro-antennas 110 of appropriate size. When the desired frequency range extends into the visible spectrum, a single microchip could be manufactured holding millions of micro-antennas 110. This is important because, as noted above, a single Josephson junction 100/ micro-antenna 110 combination produces such a very small amount of transmitted electromagnetic radiation that it is not useful for many applications. Thus, a useful transceiver 120 contains very many of these combinations.

While a micro-antenna 110 of a given size can efficiently operate over a defined range of frequencies, that range is not unbounded. Different specific applications of the transceiver 120 are best addressed using different frequency ranges. To allow for this, the transceiver 120 of FIG. 2 comprises an array of Josephson junctions 100 and micro-antennas 110 similar to the array in FIG. 1 but with one significant difference: The transceiver 120 of FIG. 2 contains multiple, disparate populations of micro-antennas 110. The micro-antennas 110 in each population are all sized for a specific frequency range, while different populations are optimized for different frequency ranges. The control logic driving the transceiver 120 can energize the separate populations of micro-antennas 110 separately or together.

When the transceiver 120 of FIG. 2 is operating for a particular application, one or another population of micro-antennas 110 is energized as appropriate for the frequency range required by that application. This allows the transceiver 120 to operate efficiently by only energizing those micro-antennas 110 that are designed for that particular frequency range while at the same time granting the transceiver 120 the freedom to operate efficiently in a different frequency range when called upon to do so.

For clarity's sake, FIG. 2 shows only two distinct populations of micro-antennas 110, but more populations can be fabricated if necessary to cover even broader frequency ranges of transmitted and received electromagnetic radiation.

Note that it is not required that only one population of micro-antennas 110 be operating at any one time: In some situations, overlapping operation of multiple populations is desirable and possible without unduly impairing efficiency.

Note also that it is the three-dimensional structure of the array of Josephson junctions 100 described in the present disclosure that allows for a substantial increase in junction density within the transceiver 120 and that in turn allows for the possibility of multiple, interleaved populations of micro-antennas 110 within a single transceiver 120.

Figure 3:
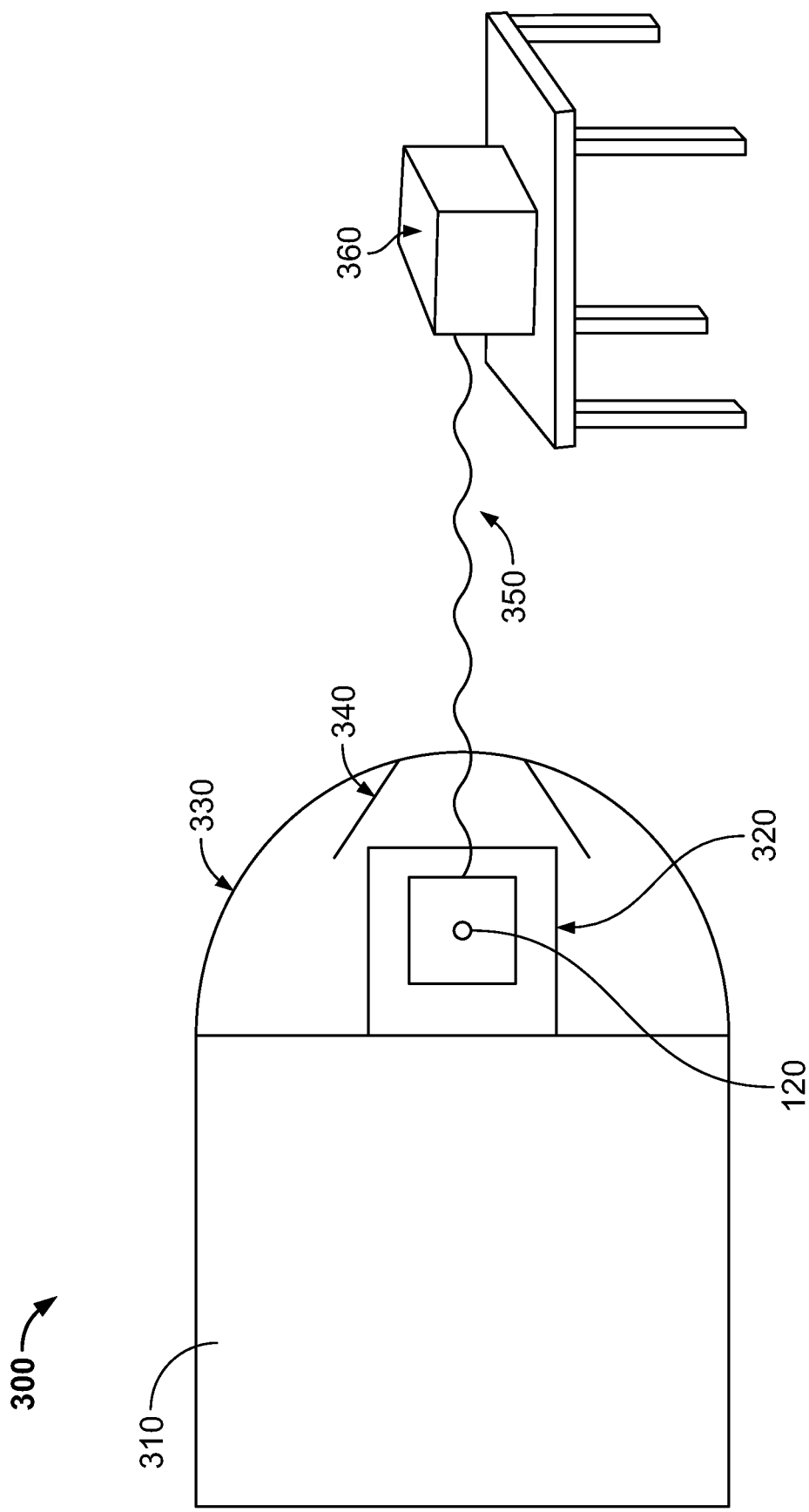
FIG. 3 is schematic of a complete detector device that uses the transceiver of FIG. 1 (and, in some embodiments, of FIG. 2)

FIG. 3 shows a detector 300 built around the Josephson junction-based transceiver 120 of FIG. 1 (and, in some embodiments, of FIG. 2). Because a wide variety of application-specific geometries are possible (to accommodate different power levels, wavelengths, etc.), FIG. 3 is only meant to provide a general schematic of some of the important components of the detector 300.

Like all presently known types of superconducting device, Josephson junctions 100 must be cooled in order to operate. (This is another reason why the transceiver 120 incorporates so many junctions 100 rather than simply upping the power sent across each junction 100: With too much power, the junctions 100 heat up, lose their superconducting ability, fail to operate, and may become irreparably damaged.) 320 represents a cryogenically cooled region fully containing the transceiver 120.

As is well known, different types of Josephson junctions 100 operate best at different temperatures. Thus, the cooling system is configured for the particular types of junctions 100 present in the transceiver 120. For example, 50 K is below the superconducting transition temperature for such high temperature superconductors as YBaCuO, similar (e.g., DyBaCuO) compounds, and iron-based superconductors. 130 K works for some mercury-based superconductors.

Within the housing 310 of the detector 300 are the supporting structures and operating controls of the cryogenic system along with the other systems necessary for running the transceiver 120 and for interpreting the results it produces.

In some embodiments, the transceiver 120 is mounted on a thermal carrier made of a material such as aluminum nitride that is thermally conductive but that does not interfere with the transceiver's transmission or reception.

Surrounding the cryogenically cooled region 320 is a vacuum-enclosing radome 330. By surrounding the cooled region 320 with a vacuum, the radome 330 lessens the cooling system's thermal burden. The radome 330 also prevents condensation on the transceiver 120 and isolates the transceiver 120 from atmospheric variations. In some embodiments, a level of vacuum no higher than about $1\times10^{-5}$ mbar is sufficient. To assist in keeping its inside temperature stable, the radome 330 may be coated with a material that is reflective at selected frequencies but is transparent to the application-dependent frequencies used by the transceiver 120.

The radome 330 is shown as hemispherical in FIG. 3, but other shapes are possible depending upon the specific applications supported by the detector 300.

Figure 4:
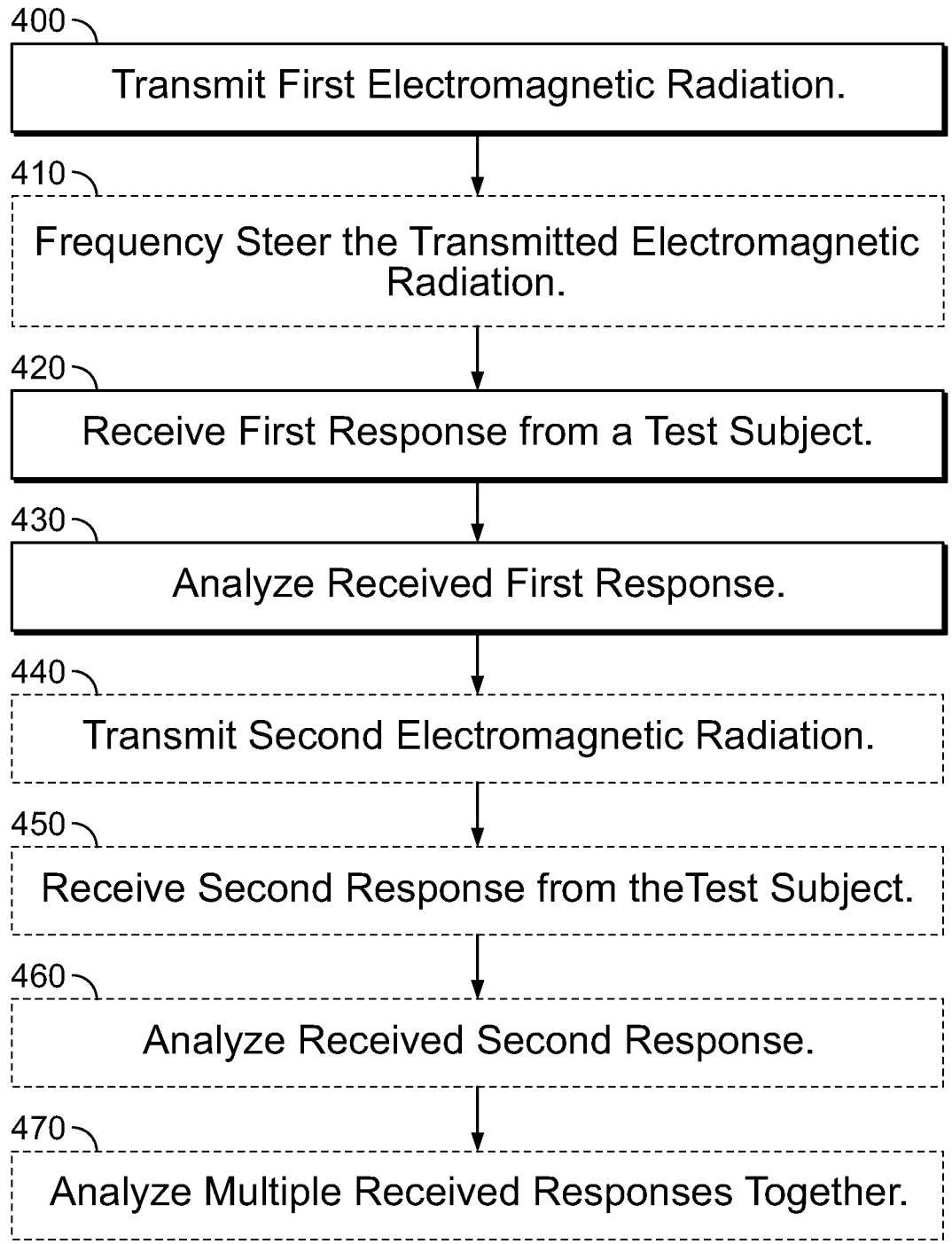
FIG. 4 is a flowchart of a representative method for using the transceiver of FIG. 1 (and, in some embodiments, of FIG. 2).

FIG. 4 presents a method of using the detector 300. In step 400, a bias current is applied across the Josephson junctions 100 which causes the array of micro-antennas 110 to emit a beam of electromagnetic radiation 350 which passes through the frequency-transparent radome 330 toward the test subject 360.

Because the micro-antennas 110 radiate at the frequency of the bias current, the controller logic of the detector 300 finely tunes that frequency within a range desired for a particular application. For example, frequencies from about 0.3 terahertz through 3 terahertz are known to be useful for many detection applications, such as medical imaging, non-destructive materials analysis, security screening for particular structures, and bomb, narcotics, and other chemical detection.

As an example of other useful applications, the controller logic can set the transceiver 120 radiating in the infrared range of frequencies useful for night vision, hyperspectral imaging, heating, communications, spectroscopy, and astronomy.

The controller logic also sets the power level of the emitted electromagnetic radiation 350. The great number of Josephson junctions 100 in such a small area achieved by putting the junctions 100 into a three-dimensional array allows the transceiver 120 to emit a very focused beam of substantial power. For very high power applications (e.g., industrial imaging), the powerful beam 350 may be emitted for a substantial period of time. In other applications such as medical imaging, a much lower power beam 350 is produced for only a fraction of a second.

In some embodiments, the transceiver 120 and the surrounding functional structures, such as the radome 330 and a beam-focusing apparatus 340, are configured to perform optimally throughout a specified transmission/reception frequency range.

In many embodiments, the array of micro-antennas 110, as driven by the controller logic, is configured to enhance the beam focus and power by means of constructive interference. Step 410 presents a feature in addition to this: Some embodiments of the detector 300 are configured to apply frequency steering to the beam 350. This allows the beam 350 to be swept across the test subject 360 which can increase the resolution of the results while decreasing the amount of power received by any one part of the test subject 360.

The emitted beam 350 hits the test subject 360 which interacts with it and then returns a beam altered by that interaction. The altered beam passes through the radome 330 and is received by the transceiver 120 in step 420. As the altered beam hits the transceiver 120, it falls upon the array of micro-antennas 110 which then drive the Josephson junctions 100. To accomplish this, the micro-antennas 110 are configured to both transmit electromagnetic radiation when driven by the Josephson junctions 100 (step 400) and to receive electromagnetic radiation to drive those junctions 100 (step 420).

The received electromagnetic radiation, as altered by its interaction with the test subject 360, is analyzed in step 430. Various analysis techniques are well known and depend upon the special characteristics of the transmitted beam 350, the information desired to be obtained, the nature of the test subject 360, and the like.

As discussed above in relation to FIG. 2, the density of Josephson junction 100/micro-antenna 110 combinations achievable by fabricating them in three dimensions allows, in some embodiments, the transceiver 120 to contain multiple, disparate populations of these combinations, each population optimized for a specific range of transmission and reception frequencies. Steps 440 through 460 take advantage of this capability by transmitting another beam 350 at a frequency different from that transmitted in step 400. When the resulting beam, as altered by its interaction with the test subject 360, is analyzed in step 460, the analysis provides different information from that obtained from the first beam in step 430.

In some cases, the second beam 350 of step 440 is directed against a test subject 360 different from that of step 400. In this case, the multiple frequency ranges supported by the detector 300 allow the detector 300 to operate in different environments, testing different types of materials. A single detector 300 can thus replace a number of the very-application-specific detectors known in the art.

In other situations, the multiple beams of steps 400 and 440 are directed against the same test subject 360, and the results are analyzed together in step 470. Testing a single test subject 360 at multiple frequencies can prise out information that may not be available when testing with a beam of a single frequency range. When directed toward one test subject 360, the multiple beams of steps 400 and 440 may be transmitted sequentially or, in some embodiments, simultaneously.

It will be understood that many additional changes in the details, materials, steps, and arrangement of parts, which have been herein described and illustrated to explain the nature of the invention, may be made by those skilled in the art within the principle and scope of the invention as expressed in the appended claims.

We claim:

1. A Josephson junction-based transceiver comprising: a three-dimensional array of Josephson junctions; and a first array of micro-antennas operatively coupled to the three-dimensional array of Josephson junctions; the first array of micro-antennas configured to transmit electromagnetic radiation when driven by the three-dimensional array of Josephson junctions; the first array of micro-antennas further configured to drive the three-dimensional array of Josephson junctions when receiving electromagnetic radiation.

2. The Josephson junction-based transceiver of claim 1 wherein the Josephson junctions are selected from the group consisting of: superconductor-insulator-superconductor tunnel junction, superconducting-normal-superconducting junction, bi-Superconducting Quantum Interference Device, grain boundary junction, bi-crystal junction, step-edge junction, ramp-edge junction, and ion-damage junction.

3. The Josephson junction-based transceiver of claim 1 wherein the micro-antennas are configured to transmit at a frequency of an alternating bias current driving the three-dimensional array of Josephson junctions.

4. The Josephson junction-based transceiver of claim 1 configured to transmit and to receive electromagnetic radiation at terahertz frequencies.

5. The Josephson junction-based transceiver of claim 1 further comprising: a second array of micro-antennas operatively coupled to the three-dimensional array of Josephson junctions; the second array of micro-antennas configured to transmit electromagnetic radiation when driven by the three-dimensional array of Josephson junctions; the second array of micro-antennas further configured to drive the three-dimensional array of Josephson junctions when receiving electromagnetic radiation; the second array of micro-antennas configured to efficiently transmit and to receive electromagnetic radiation in a frequency range different from a frequency range efficiently transmitted and received by the first array of micro-antennas.

6. An electronic microchip comprising: a Josephson junction-based transceiver comprising: a three-dimensional array of Josephson junctions; and a first array of micro-antennas operatively coupled to the three-dimensional array of Josephson junctions; the first array of micro-antennas configured to transmit electromagnetic radiation when driven by the three-dimensional array of Josephson junctions; the first array of micro-antennas further configured to drive the three-dimensional array of Josephson junctions when receiving electromagnetic radiation.

7. The electronic microchip of claim 6 wherein the Josephson junctions are selected from the group consisting of: superconductor-insulator-superconductor tunnel junction, superconducting-normal-superconducting junction, bi-Superconducting Quantum Interference Device, grain boundary junction, bi-crystal junction, step-edge junction, ramp-edge junction, and ion-damage junction.

8. The electronic microchip of claim 6 wherein the Josephson junction-based transceiver is configured to transmit and to receive electromagnetic radiation at terahertz frequencies.

9. The electronic microchip of claim 6 wherein the Josephson junction-based transceiver further comprises: a second array of micro-antennas operatively coupled to the three-dimensional array of Josephson junctions; the second array of micro-antennas configured to transmit electromagnetic radiation when driven by the three-dimensional array of Josephson junctions; the second array of micro-antennas further configured to drive the three-dimensional array of Josephson junctions when receiving electromagnetic radiation; the second array of micro-antennas configured to efficiently transmit and to receive electromagnetic radiation in a frequency range different from a frequency range efficiently transmitted and received by the first array of micro-antennas.

\* \* \* \* \*